United States Patent [19]
Allman et al.

[11] Patent Number: 5,100,503
[45] Date of Patent: Mar. 31, 1992

[54] SILICA-BASED ANTI-REFLECTIVE PLANARIZING LAYER

[75] Inventors: Derryl D. J. Allman; Brian R. Lee, both of Colorado Springs, Colo.

[73] Assignee: NCR Corporation, Dayton, Ohio

[21] Appl. No.: 637,903

[22] Filed: Jan. 7, 1991

Related U.S. Application Data

[63] Continuation-in-part of Ser. No. 582,570, Sep. 14, 1990.

[51] Int. Cl.⁵ .................. B44C 1/22; C03C 15/00; C03C 25/06; C23F 1/02
[52] U.S. Cl. .................. 156/643; 65/31; 106/16; 156/646; 156/652; 156/656; 156/657; 156/659.1; 156/661.1; 156/663; 156/904; 427/43.1; 430/5; 430/270; 430/318; 430/323
[58] Field of Search .............. 156/643, 646, 652, 656, 156/657, 659.1, 661.1, 663, 667, 668, 904; 427/43.1, 38; 430/5, 270, 323, 318; 106/14.5, 16; 65/31

[56] References Cited

U.S. PATENT DOCUMENTS

| | | | |
|---|---|---|---|
| 4,269,935 | 5/1981 | Masters et al. | 430/323 |
| 4,493,886 | 1/1985 | Lauks | 430/270 |
| 4,557,797 | 12/1985 | Fuller et al. | 156/643 |
| 4,563,241 | 1/1986 | Tanaka et al. | 156/643 |
| 4,587,138 | 5/1986 | Yau et al. | 430/271 X |
| 4,620,986 | 11/1986 | Yau et al. | 427/93 |
| 4,621,042 | 11/1986 | Pampalone et al. | 430/271 |
| 4,835,089 | 5/1989 | Iwayanagi et al. | 430/323 |

*Primary Examiner*—William A. Powell
*Attorney, Agent, or Firm*—Gregory A. Welte; Richard J. Traverso

[57] ABSTRACT

There is disclosed a dyed, spin-on glass composition with a high carbon content for use in providing antireflective planarizing layers on substrates such as semiconductor silicon wafers. These layers can be used as hard masks by etching patterns therein. These hard masks can be used in multilayer resists and in making lithography masks. Methods for producing these hardmasks are also provided.

15 Claims, No Drawings

5,100,503

SILICA-BASED ANTI-REFLECTIVE PLANARIZING LAYER

CROSS-REFERENCE TO RELATED APPLICATION

This is a continuation-in-part application of co-pending application Ser. No. 582,570 filed on Sept. 14, 1990, and assigned to the same assignee as the present invention.

BACKGROUND OF THE INVENTION

The present invention relates to a coating solution which provides an anti-reflective, planarizing layer for use in photolithography processes in the production of semi-conductor devices. This layer can function as a hard mask for plasma etching since it has an etch rate lower than that of conventional photo resists.

Increasing demand for faster integrated circuits have made imperative the development of devices with multi-level metallization layers. These developments necessitate utilization of layers of planarizing material to smooth uneven topography on the substrate so that there will be minimum thickness variation in the subsequent layers, such as a layer of photoresist material. The need to provide uniform layers of resist material increases as the device dimensions shrink.

The topography of an underlying substrate can cause optical interference in the photolithography process by reflection of the photons. Anti-reflective coatings have been used so as to prevent interference from the reflection of the irradiating beam. It is conventional to incorporate a dye into the anti-reflective layer to prevent loss of resolution resulting from substrate reflection.

In conventional processes, separate layers provide planarization and anti-reflection. Organic planarization layers are typically used in photolithography techniques since the planarization layer must achieve good pattern transfer from the top photoresist layer. Fuller et al., U.S. Pat. No. 4,557,797 disclose the use of a polymethylmethacrylate planarization layer. Pampalone et al., U.S. Pat. No. 4,621,042 discloses the use of an orthocresol novolak resin for planarizing a semi-conductor surface. Because it is often difficult to solubilize a suitable dye within the organic planarizing layer, a separate layer containing a dye is used as the anti-reflective coating. Organic compositions containing a dye are typically used to provide anti-reflective coatings.

It is desirable to provide a composition which will produce a layer that both planarizes and absorbs light.

Spin-on-glass compositions have been used as planarizing layers for other processes, such as the insulating layer between the metallization circuitry. The composition is applied to a semi-conductor wafer, spun and dried to form a solid layer that is subsequently cured at high temperatures to form a hard silica-based (glassy) layer. Despite various formulations for the spin-on-glass compositions, a number of limitations exist with respect to the production and use of most spin-on-glass compositions. Problems of surface damage from subsequent processing, poor adhesion and short shelf-life, among others have limited the utility of these compositions as planarizing layers. Limitations on thickness are also recognized due to the brittleness of the spin-on-glass layers.

A further limitation on spin-on-glass compositions as planarizing layers for photoresists is that it is difficult to control the plasma etch rate of the layers produced. This can result in the formation of recesses and losses in pattern resolution when transferred from a top layer of photoresist to an underlying metallization layer.

SUMMARY OF THE INVENTION

It is an object of the present invention to provide a spin-on-glass composition which will provide an anti-reflective, planarizing layer for photolithography processes.

It is another object of the present invention to provide a method for producing a pattern in a layer obtained from such a composition for subsequent processing.

It is a further object of the present invention to provide a hard mask comprising a patterned layer obtained from the spin-on-glass composition of the present invention.

Upon further study of the specification and appended claims, further objects and advantages of this invention will become apparent to those skilled in the art.

The spin-on-glass composition of the present invention comprises a solution of crosslinked polyorganosiloxane polymers which contain an inorganic dye that absorbs light, said polyorganosiloxane polymers having at least 30 atomic wt. % carbon and an aminoorganotrialkoxysilane incorporated therein, wherein the alkoxy groups have from 1 to 4 carbon atoms.

A process for forming a patterned layer on a semi-conductor substrate is also provided by the present invention. The process comprises depositing a metallic conductive layer on a semi-conductor substrate having partially formed structures thereon and depositing a spin-on-glass layer over said conductive layer at a thickness sufficient to provide a substantially planar, anti-reflective surface, wherein said spin-on-glass layer is obtained from a composition of the present invention. A photo-resist material is then deposited over the spin-on-glass layer. Portions of the photo-resist are exposed to light and developed to remove portions thereof and expose the underlying spin-on-glass layer. The exposed portions of spin-on-glass are then etched to expose the underlying portions of conductive material.

The hard mask of the present invention comprises a substrate and a patterned silica-based layer obtained from a spin-on-glass composition of the present invention. The layer is patterned by etching exposed portions thereof.

DESCRIPTION OF THE PREFERRED EMBODIMENTS

The dyed spin-on-glass composition of the present invention is a solution of cross-linked polyorganosiloxane containing a dye. The polyorganosiloxane has a carbon content of at least 30 atomic wt. % carbon and a silane adhesion promoter incorporated therein. Inorganic dyes such as titanium dioxide $Cr_2O_3$, $MoO_4$, $MnO_4$, and $ScO_4$, are preferred since they remain stable at temperatures in excess of 90° C. Organic dyes will generally not remain stable when the spin-on-glass is cured at temperatures of 350°–500° C. and therefore, are not preferred. The weight ratio of dye to polymer ranges from about 0.5:1 to 3.5:1.

To achieve a high carbon content within the polymer, the backbone of the cross-linked polyorganosiloxane is derived from a mixture of alkoxysilanes, some or all of which are substituted with organic radicals, preferably $C_1$–$C_4$-alkyl radicals and phenyl radicals. The carbon content is determined by the number of such organo-substituted alkoxysilanes incorporated in the polymer chain.

The preferred substituents are methyl and phenyl radicals. These substituents show high bonding energy with silica and do not dissociate when the spin-on glass layer is exposed to high temperatures during cure. Other alkyl substituents such as ethyl, propyl and butyl radicals are acceptable where this dissociation can be avoided or ignored.

In preferred embodiments, the crosslinked polyorganosiloxane has both methyl and phenyl radicals as substituents. Spin-on glass compositions having only phenyl substituents on the siloxane polymer provide layers which are difficult to etch with conventional equipment. The ratio of methyl to phenyl substituents preferably ranges from 1:1 to 1:3. Most preferably, a portion of the silica atoms in the crosslinked polyorganosiloxane have both methyl and phenyl substituents bonded thereto. This can be accomplished where the crosslinked polyorganosiloxane is derived from methylphenylalkoxysilanes. Such crosslinked polyorganosiloxanes provide coating layers with excellent resistance to cracking from subsequent processing.

The high organic content contributes to a low silanol content and low alkoxy content in the crosslinked polyorganosiloxanes used within the dyed spin-on glass compositions. Preferably, the silanol content is less than 1.4 wt. % and the alkoxy content is less than 0.1 wt. %. These low values are also attributed to the cross-links in the polymer.

The carbon content of the crosslinked polyorganosiloxane can be determined using thermal gravimetric analysis, wherein a weighed sample is decomposed as it is heated slowly in a thermoanalyzer. The weight of the residue is then compared to the initial weight and the difference is considered lost organic material.

Incorporated within the crosslinked polyorganosiloxane used in the dyed spin-on glass compositions of the present invention is a silane adhesion promoter. These silanes are well known in the industry for improving the adhesion between organic resins and inorganic media such as glass, sand or fillers. These silane adhesion promoters have two types of substituents, one is an organofunctional radical bonded directly to the silicon atom and the other is an organic substituent bound through oxygen such as $C_1$-$C_4$-acetoxy. These alkoxy/acetoxy groups allow for incorporation of the silane into the crosslinked polyorganosiloxane. Preferably, the organofunctional silane has three $C_1$-$C_4$-alkoxy groups and, most preferably, they are ethoxy or methoxy.

Commercially available silane adhesion promoters have aminoorgano-, ureidoorgano- or glycidoxyorgano-functional groups. Aminoorganotri($C_1$-$C_4$)alkoxysilanes are preferred, examples of which include gamma-aminopropyltriethoxysilane, gamma-aminopropyltrimethoxysilane, N-beta-(aminoethyl)-gamma-aminopropyltriethoxysilane and N-beta-(aminoethyl)-N-beta-(aminoethyl)-gamma-amino-propyltrimethoxysilane. The most preferred organofunctional silane adhesion promoter is gamma-aminopropyltriethoxysilane.

The aminoorganotri($C_1$-$C_4$)alkoxysilanes are preferably incorporated at levels of 10-50 weight percent of the crosslinked polyorganosiloxane. Such levels provide a significant degree of crosslinking. The polymer obtained can be characterized as a polyorganosilsesquioxane due to the crosslinking obtained. The crosslinked organopolysiloxanes used in the spin-on glass compositions of the present invention may have a structure consistent with the "cubical octamer" structure, double chain "ladder" structure or both. A. J. Barry et al. describe these structures in Chapter 5 of *Inorganic Polymers*, Ed. Stone and Graham, New York, Academic Press, 1962, p. 195. These are complicated structures which result from the trifunctionality of the trialkoxysilanes having but one organic group on each silicon atom. Although tetraalkoxysilanes and diorganoalkoxysilanes can be incorporated in these polymers, a significant portion of the polymer is derived from trifunctional silanes.

The weight average molecular weight of the crosslinked polyorganosilane polymer used in the dyed spin-on glass composition of the present invention may range from about 2,000 up to above 20,000. The only limits on the polymer molecular weight are that the polymer must be soluble in an inert organic solvent and that the solution formed be sufficiently low in viscosity to allow uniform coating.

In the dyed spin-on glass compositions of this invention, the crosslinked polyorganosiloxane and dye are in solution, preferably at a concentration of from about 5 to 40 wt. %, most preferably 5 to 20 wt. %, total solids at the weight ratios given above. Suitable solvents include monohydric and polyhydric alcohols and glycol ethers. The following are mentioned as examples of suitable monohydric alcohols: 1-butanol, 2-butanol, 2-methyl-1-propanol, 2-methyl-2-propanol and 1-phenol. Suitable polyhydric and oligomeric alcohols are: ethyleneglycolmonoethylether, diethyleneglycolmonoethylether, triethyleneglycolmonoethylether, propyleneglycolmonoethylether, dipropyleneglycolmonoethylether and dipropyleneglycolmonomethylether. Mixtures of these alcohols are also suitable. To facilitate drying, the inert organic solvent should have a boiling point below 250° C., preferably above 80° C. Preferably, N-butanol and isopropyl are used.

The dyed spin-on glass composition of the present invention has a pH in the range of 3-7, preferably from 6-6.7. The acidic pH is provided by an organic acid or hydrogen peroxide. The preferred acid is acetic acid. The viscosity of the dyed spin-on glass composition preferably ranges from about 3.5 to 9 centistokes at the preferred solids level of 5 to 20 wt. %. If the viscosity is too low, multiple coats are necessary to obtain a thick spin-on glass layer. If the viscosity is too high, uniformity may be difficult to achieve when coating a substrate.

The dyed spin-on glass compositions of the present invention are stable, i.e., they do not increase in viscosity at ambient temperature, for periods in excess of one year.

The above spin-on glass compositions of this invention are prepared by dissolving a polyorganosiloxane having a carbon content of at least 30 wt. % within an organic solvent. The solvent is preferably a mono- or polyhydric alcohol or glycol ether having a boiling point of less than 250° C. and preferably greater than 80° C. Suitable species are as described above. N-butanol and isopropyl alcohol are preferred.

Polyorganosiloxanes with a high carbon content can be obtained by cohydrolyzing a mixture of alkoxysilanes, some or all of which are substituted with organic radicals, preferably $C_1$-$C_4$-alkyl and phenyl radicals. As precursors to the polymers in the spin-on glass composition of the present invention, these polyorganosiloxane contain the desired level of methyl and phenyl substituents. Therefore, the methyl to phenyl ratio preferably ranges from 1:1 to 1:3, as in the crosslinked polyorganosiloxanes described above. Furthermore, these polyorganosiloxanes will contain those silicon atoms having both methyl and phenyl groups bound thereto.

The polyorganosiloxanes used in the process of this invention may be linear or they may have a significant number of crosslinks to the extent that they are polysilsesquioxane polymers. They are limited in structure and molecular weight only to the extent that they must remain soluble within an inert organic solvent.

Two or more polyorganosiloxanes may be used in varying proportions in the process of this invention to provide the spin-on glass compositions. However, it is preferable if blends are not used so as to ensure a consistent structure.

The silanol content of the polyorganosiloxanes are low due to the high organic content and sometimes, also due to crosslinking. Preferably, the silanol content is below 13 wt. % and the alkoxy content is less than 10 wt. %.

The carbon content in the preferred polymethylphenylsiloxanes ranges from about 40–50 atomic weight percent; however, the polyorganosiloxanes with a higher carbon content are suitable.

The dissolved polyorganosiloxane is reacted with a silane adhesion promoter, preferably an aminoorganotri($C_1$–$C_4$)-alkoxysilane, most preferably gamma-aminopropyltriethoxysilane, under alkaline conditions. The aminoorganotri($C_1$–$C_4$)alkoxysilanes are sufficiently alkaline so as not to require addition of a base to the solution. Where the silane adhesion promoter is non-alkaline, it is expected a volatile organic amine may be introduce to promote reaction. The pH of the reaction medium is preferably 9 or above.

The amount of silane adhesion promoter reacted with the polyorganosiloxane can vary widely, but is preferably used in a weight ratio within the range of 0.11:1 to 1:1 of silane to polyorganosiloxane.

The pH of the reaction medium is reduced when it is desirable to slow down or arrest the reaction. The duration of the reaction will depend on the reaction rate, which is influenced by temperature and pressure. A reaction that proceeds for two hours or more at ambient temperature will be effective in producing spin-on glass compositions.

To substantially arrest the reaction, the pH should be reduced below 7, but not below 3.0, or acid catalyzed hydrolysis will proceed. The preferred pH range is 5 to below about 7, most preferably 6 to 6.7. This can be accomplished by the addition of an organic acid, such as acetic acid or hydrogen peroxide. The use of acetic acid is preferred.

Once the reaction has been stopped, it is preferable to age the composition before use, preferably for about one week. It is also preferable to filter the solution with a submicron filter, such as a 0.2 micron teflon filter, so as to remove any precipitate that forms during reaction. The composition will remain stable thereafter for periods in excess of one year.

The dye can be added to the solution before reaction with the adherence promotor, or it can be added after the organic acid or $H_2O_2$.

The dyed spin-on glass composition of this invention can be applied to a substrate by a conventional spin-coat technique wherein a substrate (wafer) is spun at a rate in excess of 1,000 rpm to generate a uniform layer of the spin-on glass composition. Any known coating method is suitable including the spin method, roller coater method, dipping and pull-up method, spray method, screen printing method, brushing method and the like. Suitable substrates include semi-conductors, silicon wafers, glass plates, metal plates and the like.

The thickness of the layer can be modified by varying the viscosity of the spin-on glass composition. Anti-reflective planar layers in excess of 500 Å can be obtained with multiple applications. The spin-on glass composition is then dried by heating the wafer to about 200° C. After the coating is dried, the coated substrate is heated to a temperature of from about 350°–500° C. to cure the spin-on glass coating and form a smooth, anti-reflective planarization layer. The dyed spin-on glass composition preferably exhibits low shrinkage once dried. Vertical shrinkage as high as 15% may be acceptable, however, it is preferable for shrinkage to be below about 10%, which is easily obtained with preferred embodiments.

Dyed spin-on glass compositions of the present invention can provide anti-reflective planarization layers in excess of 500 Å and also in excess of 5,000 Å without cracking or loss in subsequent processing.

The anti-reflective planarization layers provided by the dyed spin-on glass compositions of the present invention show superior resistance to oxygen during etching with $CHF_3$ and $O_2$, particularly where the crosslinked polyorganosiloxane contains a large number of phenyl radicals.

The dyed spin-on glass compositions of this invention also provide hard masks when layers thereof are patterned by plasma etching in predetermined areas. These hard masks can form part of a multilayer resist for patterning an underlying layer such as a conductive layer. They can also be positioned on a transparent substrate for the preparation of lithographic masks.

A multilayer resist positioned above a layer to be patterned need only comprise the hard mask provided by the dyed spin-on glass composition and a layer of photoresist material. It may be desirable to have intermediate layers between the hard mask and the underlying layer or the layer of photoresist material. A suitable intermediate layer would be one provided by another spin-on glass composition.

Hard masks are obtained by first depositing on a substrate, a silica based layer derived from a dyed spin-on glass composition of this invention, which preferably has a substantially planar top surface. A substantially uniform layer of photoresist material is deposited on this silica-based layer. This photoresist is then illuminated with light in a predetermined pattern and developed so as to remove portions thereof and expose the underlying silica-based layer. The exposed portions of the silica based layer are then etched with a plasma until the underlying substrate is exposed in a pattern substantially similar to the predetermined pattern formed within the photoresist.

The exposed areas of the underlying substrate can then be processed further, if desired, by methods such as etching. The hard mask is typically etched away with an $O_2$ plasma when processing is complete. Only slight losses in pattern definition result because the silica-based layer is resistant to etching and the rate of etch can be controlled.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth in degrees Celsius, unless otherwise indicated, and all parts and percentages are by weight.

The entire disclosure of all applications, patents and publications, cited above and below, are hereby incorporated by reference.

EXAMPLES

Example 1

A dyed spin-on glass composition was prepared by dissolving 52 g of polymethylphenylsiloxane polymer in 800 ml of N-butanol. The polymer was obtained from Owens, Ill. as solid flakes. The silanol content of the polymer was about 13% to 14% by weight and the ethoxy content was about 8% by weight. The carbon content was above 40 atomic weight percent as determined by thermalgravimetric analysis of an earlier sample, wherein the sample was weighed and heated up to 600° C. at a rate of 2° C. per minute and cooled at the same rate to ambient temperature. The residue was weighed after cooling and the weight loss was taken as the carbon content. A quantity of aluminum oxide was heated alongside the resin sample and showed no weight loss or gain from the thermalgravimetric analysis.

The polyorganosiloxane dissolved in the N-butanol within one half hour, after which, 7.2 ml of gamma-aminopropyltriethoxysilane was added by pipet with stirring within one minute. The silane was distilled from a silane solution sold by Union Carbide under the designation A1100. The solution was maintained at a constant temperature (23° C.) during reaction, which was allowed to continue for about 8 hours with stirring, after which 7.0 ml of acetic acid (electronic grade) was added. A precipitate had formed within the solution.

After the addition of acid, the pH fell to about 6.5. About 40 grams of Ti (IV) butoxide were added to the solution, which converts to $TiO_2$ in solution. The solution was aged for one week and subsequently filtered to 0.2 micrometers with a teflon filter to remove the precipitate. The solids concentration of the solution was about 6 wt. % and the viscosity was about 4 centistokes. The polymethylphenylsilsesquioxane polymer produced had a silanol content of about 1.5% and an alkoxy content of less than 0.1%.

Spin-On Glass Layer

About 1 g of solution was applied to a silicon wafer 4 inches in diameter. The wafer was rotated on a spinner for about 3 seconds at 1000 rpm and then at 4,500 rpm for about 30 seconds. The composition coated the wafer uniformly without bubble formation or blistering. The wafer was then transferred to an Ellipsometer to determine thickness and refractive index at different points on the wafer. The refractive index typically has an average value of about 1.5 and the average thickness was about 1,500 Å. Following measurement, the wafer was transferred to a hot plate and heated to about 200° C. for about 1 minute to dry the coating. The coating thickness and refractive index were measured again with the Ellipsometer and percent vertical shrinkage was calculated which is typically less than about 10%.

The coating procedure was repeated until the multiple layers had a total thickness in the range of 4,000–10,000 Å.

Once the desired thickness was obtained, the wafer was transferred to a tube furnace and heated to about 400° C. under nitrogen for 60 minutes. The centers of the wafers were then measured using an Ellipsometer to determine the index of refraction and the thickness of the wafer at 9 points, the average of these values are reported as the coating thickness and refractive index. The refractive index is typically about 1.49 and the thickness was within the range of 4,000–9,000 Å. No cracks or pin holes were detected in the coating. The coating has an etch rate about equivalent to that of a film without dye that contains the same siloxane polymer. An etching process with such a SOG layer is illustrated below.

Etching Process

Silica-based films prepared as described above but without dye were subjected to etch with $CHF_3$ and $O_2$ in an Applied Materials AME 8110 Reactive Ion Etcher. The rate of etch for these films is about the same as a film containing dye. The etch rate for a number of samples were determined with different oxygen flow rates. The etch rates of silica-based films obtained from two commercially available spin-on glass compositions (without a dye) were also tested at different oxygen flow rates. The results are summarized in the table below:

TABLE 1

| $O_2$ flow rate SCCM | Etch Rate Å/min | | |
|---|---|---|---|
| | Example* (300° C.) | ACC[1] 108 (425° C.) | ACC[2] 110 (425° C.) |
| 4 | | | 150 |
| 5 | | 120 | 175 |
| 6 | 60 | | |
| 7 | | 190 | 225 |
| 8 | 75 | | |
| 9 | | 280 | 350 |
| 10 | 110 | | |
| 13 | 160 | | |
| 15 | 220 | | |
| 17 | 225 | | |

[1]ACC 108 = Accuglass 108 (Allied Chemical) w/o a dye.
[2]ACC 110 = Accuglass 110 (Allied Chemical) w/o a dye.
*The film did not contain a dye.

The data in Table 1 show the high resistance of the silica-based layers produced by the composition of the present invention to changes in the oxygen concentration when etching with $CHF_3$.

From the foregoing description, one skilled in the art can easily ascertain the essential characteristics of this invention, without departing from the spirit and scope thereof, and can make various changes and modifications of the invention to adapt it to various usages and conditions.

What is claimed is:

1. A dyed spin-on glass composition comprising a solution of crosslinked polyorganosiloxane and a dye that is stable at temperatures of 350°–500° C. and absorbs light, said polyorganosiloxane having at least 30 atomic weight percent carbon and an aminoorganotrialkoxysilane incorporated therein, wherein the alkoxy groups have 1–4 carbon atoms.

2. A dyed spin-on glass composition comprising a solution of polymethylphenylsilsesquioxane and an inorganic dye that absorbs light, said polymethylphenylsilsesquioxane polymer having a carbon content of at least 30 weight percent and an aminoorganotrialkoxy silane incorporated therein, wherein the alkoxy groups have from 1–4 carbon atoms.

3. A dyed spin-on glass composition as in claim 2, wherein the polymethylphenylsilsesquioxane has sufficient phenyl groups to provide a cured layer with an etch rate below 200 Å/min in $CHF_3$.

4. A dyed spin-on glass composition as in claim 2, wherein the inorganic dye is $TiO_2$, $Cr_2O_7$, $MoO_4$, $MnO_4$ or $ScO_4$, and the aminoorgano-trialkoxy silane is gamma-aminopropyltriethoxy silane.

5. A semiconductor device having an antireflective planar layer derived from a dyed spin-on glass composition of claim 1.

6. A semiconductor device as in claim 5, wherein said anti-reflective planar layer has a thickness above 500 Å.

7. A hard mask comprising an anti-reflective planar layer on a substrate, wherein the anti-reflective planar layer is derived from a dyed spin-on glass of claim 1, and wherein portions of said substrate are exposed between portions of said anti-reflective planar layer in a predetermined pattern.

8. A multilayer resist comprising a hard mask of claim 7 on a substrate and a layer of photoresist material positioned above said hard mask having substantially the same pattern.

9. A multilayer resist as in claim 8 which additionally comprises an intermediate layer positioned between the substrate and the hard mask, said intermediate layer having substantially the same pattern as the hard mask and layer of photoresist material.

10. A lithographic mask comprising a hard mask of claim 7 on a transparent substrate.

11. A hard mask as in claim 7, wherein the substrate is a conductive layer or an oxide layer.

12. A method for producing a hard mask which comprises:
a) depositing on a substrate, an anti-reflective planar, silica-based layer derived from a dyed spin-on glass composition, said dyed spin-on glass composition comprising a solution of crosslinked polyorganosiloxane and an inorganic dye that absorbs light, said polyorganosiloxane having at least 30 atomic weight percent carbon and an aminoorganotrialkoxysilane incorporated therein, wherein the alkoxy groups have 1–4 carbon atoms;
b) depositing a substantially uniform layer of photoresist material on the silica-based layer;
c) illuminating portions of said layer of photoresist with light in a predetermined pattern;
d) developing the photoresist so as to remove portions differentiated by the illumination with light and expose portions of the underlying silica-based layer; and
e) etching the exposed portions of the underlying silica-based layer so as to expose the underlying substrate in a pattern substantially identical to the illuminated portions of said photoresist.

13. A method as in claim 12, wherein the underlying substrate is a conductive layer and the inorganic dye is $TiO_2$, $Cr_2O_7$, $MoO_4$, $MnO_4$ or $ScO_4$.

14. A method of patterning a conductive layer which comprises:
(a) forming a hard mask on a conductive layer as in claim 13;
(b) etching the exposed portions of conductive layer to define a pattern which substantially conforms to the pattern of the hard mask; and
(c) etching the photoresist layer and hard mask so as to expose the underlying conductive layer.

15. A method as in claim 12, wherein the underlying substrate is an intermediate layer obtained from another spin-on glass composition.

* * * * *